(12) United States Patent
Thiel

(10) Patent No.: US 7,045,562 B2
(45) Date of Patent: May 16, 2006

(54) METHOD AND STRUCTURE FOR SELF HEALING CRACKS IN UNDERFILL MATERIAL BETWEEN AN I/C CHIP AND A SUBSTRATE BONDED TOGETHER WITH SOLDER BALLS

(75) Inventor: George H. Thiel, Endicott, NY (US)

(73) Assignee: International Business Machines Corporation, Armonk, NY (US)

( * ) Notice: Subject to any disclaimer, the term of this patent is extended or adjusted under 35 U.S.C. 154(b) by 354 days.

(21) Appl. No.: 10/688,689

(22) Filed: Oct. 16, 2003

(65) Prior Publication Data
US 2005/0085564 A1    Apr. 21, 2005

(51) Int. Cl.
C08K 9/10 (2006.01)
C08L 63/00 (2006.01)
H01L 21/56 (2006.01)
H01L 21/58 (2006.01)

(52) U.S. Cl. ............. 523/205; 438/127; 523/207; 525/529

(58) Field of Classification Search ............ None
See application file for complete search history.

(56) References Cited

U.S. PATENT DOCUMENTS

| | | | | |
|---|---|---|---|---|
| 5,589,523 | A * | 12/1996 | Sawaoka et al. | 523/211 |
| 6,020,385 | A   | 2/2000  | Halle et al.   | 521/31  |
| 6,235,856 | B1 * | 5/2001 | Hafner et al.  | 526/171 |
| 6,261,871 | B1  | 7/2001  | Langari et al. | 438/124 |
| 6,375,872 | B1  | 4/2002  | Chao           | 264/4.33|
| 6,479,167 | B1  | 11/2002 | Sumita et al.  | 428/620 |
| 6,486,099 | B1  | 11/2002 | Igari et al.   | 504/359 |
| 6,500,564 | B1  | 12/2002 | Shiobara et al.| 428/620 |
| 6,617,046 | B1 * | 9/2003 | Noro et al.    | 428/620 |
| 2004/0055686 | A1 * | 3/2004 | Cowger et al. | 152/516 |

OTHER PUBLICATIONS

CAPLUS accession No. 2002:175108, Sakurai, "Polymeric materials having autonomic heaing properties," Kagaku to Kogyo, vol. 54, No. 11, 2001, abstract.*
CAPLUS accession No. 2003:446302, Brown et al., "Fracture and fatigue behavior of a self-healing polymer composite," Materials Research Society Symposium Proceedings, 2003, abstract.*
CAPLUS accession No. 2003:595414, Kessler et al., "Self-healing structural composite materials," Composites, Part A: Applied Science and Manufacturing, 2003, abstract.*
White et al., "Autonomic healing of polymer composites," Nature, vol. 409, 2001, pp. 794-797.*
Brown et al., "In situ poly(urea-formaldehyde) microencapsulation of dicyclopentadiene," Journal of Microencapsulation, vol. 20, No. 6, Nov.-Dec. 2003, pp. 719-730.*
"Autonomic healing of polymer composites", letters to nature, Nature 409, 794-797 (2001), Feb. 15, 2001.
"*In situ* (urea-formaldehyde) microencapsulation of dicyclopentadiene", E.N. Brown et al, Journal of Microencapsulation pp. 1-14 plus List of Recent TAM Reports, 2003.

* cited by examiner

*Primary Examiner*—Robert Sellers
(74) *Attorney, Agent, or Firm*—William N. Hogg

(57) ABSTRACT

A method of self-healing cracks in a cured epoxy base underfill material between an I/C chip and a substrate is provided. A plurality of capsules is dispersed in the epoxy base. Each capsule has a curable thermosetting adhesive encapsulated in a rupturable shell to disperse the thermosetting adhesive in a crack in the epoxy base when the shell ruptures. Each capsule is less than 25 microns in diameter. A curing agent that will cause a reaction of the thermosetting adhesive on contact is dispersed in the epoxy to form a cured adhesive in a crack in said epoxy base. The shell will rupture when encountering a crack being propagated in the underfill material, which will at least partially fill the crack with the adhesive, and cure the adhesive with the curing agent to bond the edges of the crack together. The invention also includes the structure for crack self-healing.

14 Claims, 2 Drawing Sheets

METHOD AND STRUCTURE FOR SELF HEALING CRACKS IN UNDERFILL MATERIAL BETWEEN AN I/C CHIP AND A SUBSTRATE BONDED TOGETHER WITH SOLDER BALLS

FIELD OF THE INVENTION

The invention generally relates to preventing the deleterious effects of cracking and crack propagation in underfill material between an I/C chip and a substrate, wherein the chip is joined to the substrate by solder balls, sometimes referred to as C4 joints, and more particularly to healing of cracks that form in underfill material between an I/C chip and a substrate with solder ball bonds.

BACKGROUND OF THE INVENTION

The cracking of underfill material that encapsulates solder balls joining an I/C chip to a substrate often leads to electrical failures. These cracks may be developed during assembly or during thermal cycling (either reliability testing or field cycles). These cracks will increase in length as the electronic package experiences an increasing number of thermal cycles. The propagation of these cracks has been known to cause electrical fails in copper lines and C4 joints. Typically, the solution to this problem is to avoid generating cracks in the first place. However, normal variability in assembly conditions may cause cracks to be formed. As electronic packages are exposed to higher temperatures and stress in lead-free solder applications, the opportunity to cause cracks increases.

SUMMARY OF THE INVENTION

A method of self-healing cracks in a cured epoxy base underfill material between an I/C chip and a substrate is provided. A plurality of capsules is dispersed in the epoxy base. Each capsule has a curable thermosetting adhesive encapsulated in a rupturable shell to disperse the thermosetting adhesive in a crack in the epoxy base when the shell ruptures. Each capsule preferably is 25, and more preferably 10 or less, microns in diameter. A curing agent that will cause a reaction of the thermosetting adhesive on contact is dispersed in the epoxy to form a cured adhesive in a crack in said epoxy base. The shell will rupture when encountering a crack being propagated in the underfill material, which will at least partially fill the crack with the adhesive, and the curing agent will cure the adhesive to bond the edges of the crack together. The invention also includes the structure for crack self-healing.

DESCRIPTION OF THE PREFERRED EMBODIMENT(S)

Figure 1:
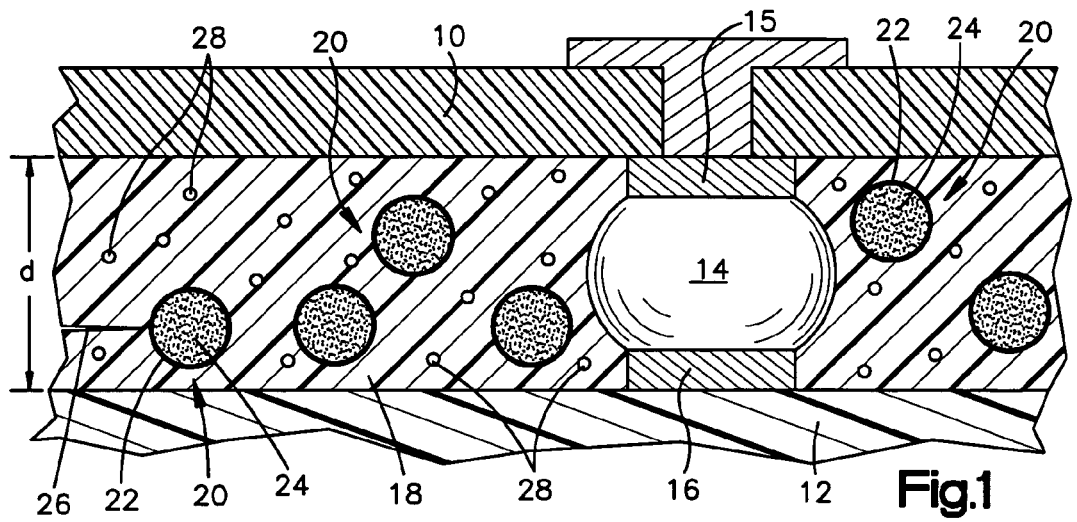
FIGS. 1–3 show schematically the progression of a crack propagating in an underfill material surrounding C4 joints in an I/C chip bonded to a substrate, and the self healing thereof according to this invention.
Figure 2:
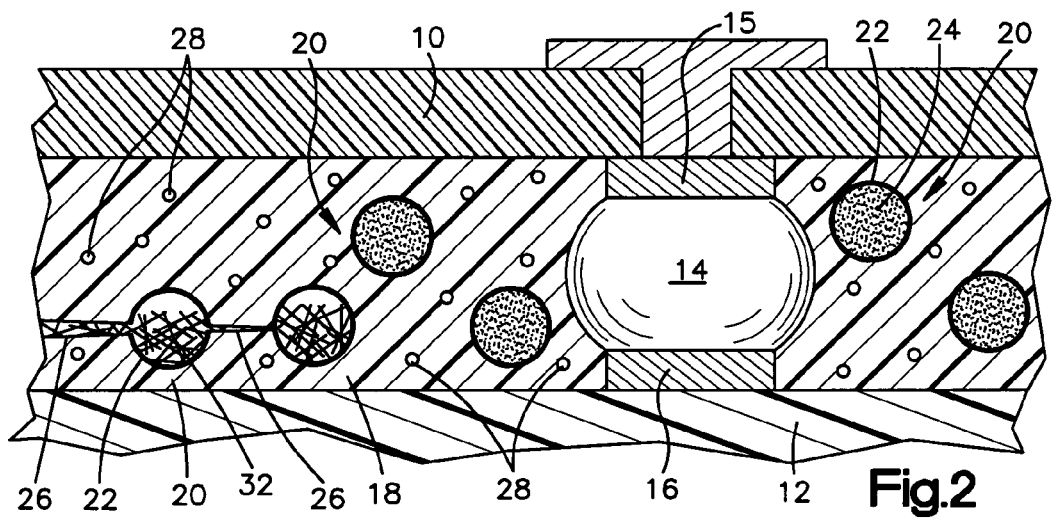
Figure 3:
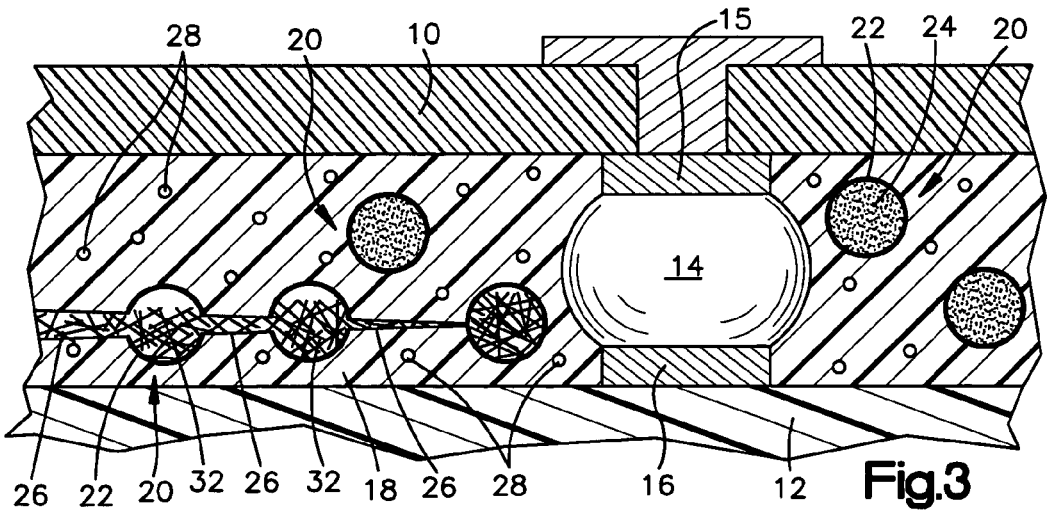

According to the present invention, a method and structure for self healing cracks that propagate in an underfill material surrounding solder ball or C4 connections connecting an I/C chip to a circuitized structure is provided. FIGS. 1–3 show diagrammatically the structure and the propagation of a crack, and how the invention self heals the propagating crack with a thermosetting adhesive that is cured in situ. (These figures are similar to those shown in the *Nature Magazine* article cited infra.)

Referring now to FIG. 1, the structure includes an I/C chip 10 mounted to a circuitized substrate 12 by conventional solder ball or C4 joints 14 between pads 15 on chip 10 and pads 16 on substrate 12. This type of structure need not be described further. The distance d between the chip 10 and substrate 12 is typically about 100 microns. An underfill material 18 is disposed between the chip 10 and substrate 12 surrounding the C4 joints 14. Conventionally, the underfill material is a cured epoxy. As depicted, the underfill material is shown only between the chip 10 and substrate 12, but it is to be understood that in some cases the underfill material may also encapsulate the chip 10.

Embedded in the material 18 is a plurality of capsules 20. The capsules 20 are comprised of a rupturable shell 22 encapsulating an encapsulate 24. The encapsulate 24 is a material in the unreacted or non-polymerized state but which can be reacted or polymerized to form an adherent adhesive. Preferably, the encapsulated material is a thermosetting adhesive, such as dicycyclopentadiene. The rupturable shell material 22 is preferably urea-formaldehyde. The rupturable shell material 22 must be sufficiently strong to hold the encapsulate 24 unreacted or unpolymerized under normal environmental conditions, but rupturable responsive to encountering a crack 26 propagating through the material 18, as shown in FIGS. 2 and 3. To insure that the capsules 20 are maintained in the unruptured form, it is necessary that they be less than about 25, and preferably about 10 or less, microns in diameter.

Also dispersed in the material 18 is an actuator or curing agent or catalyst, hereinafter sometimes referred to collectively as curing agent 28, which when it contacts the encapsulate 24 will cause the encapsulate 24 to harden or polymerize. Since the encapsulate 24 is used to fill and adhere to a propagating crack 26 (as will be described presently), it is sometimes referred to generally as a thermosetting adhesive. When the encapsulate is dicycyclopentadiene, the preferred actuator or catalyst 28 is a Ruthenium based catalyst. When the catalyst 28 contacts the encapsulate 24, it will cause it to polymerize or harden to a thermosetting adhesive, and any of the encapsulate that has entered the crack 26 will polymerize to polymerized material 32 in the crack 26, and any material 24 remaining in the shell 22 will also polymerize as polymerized material 32 within shell 22, all as shown in FIGS. 2 and 3. Thus the crack 26 is "healed" by the hardening or polymerization of the encapsulate in the crack 26 as a thermosetting adhesive 32.

Figure 4:
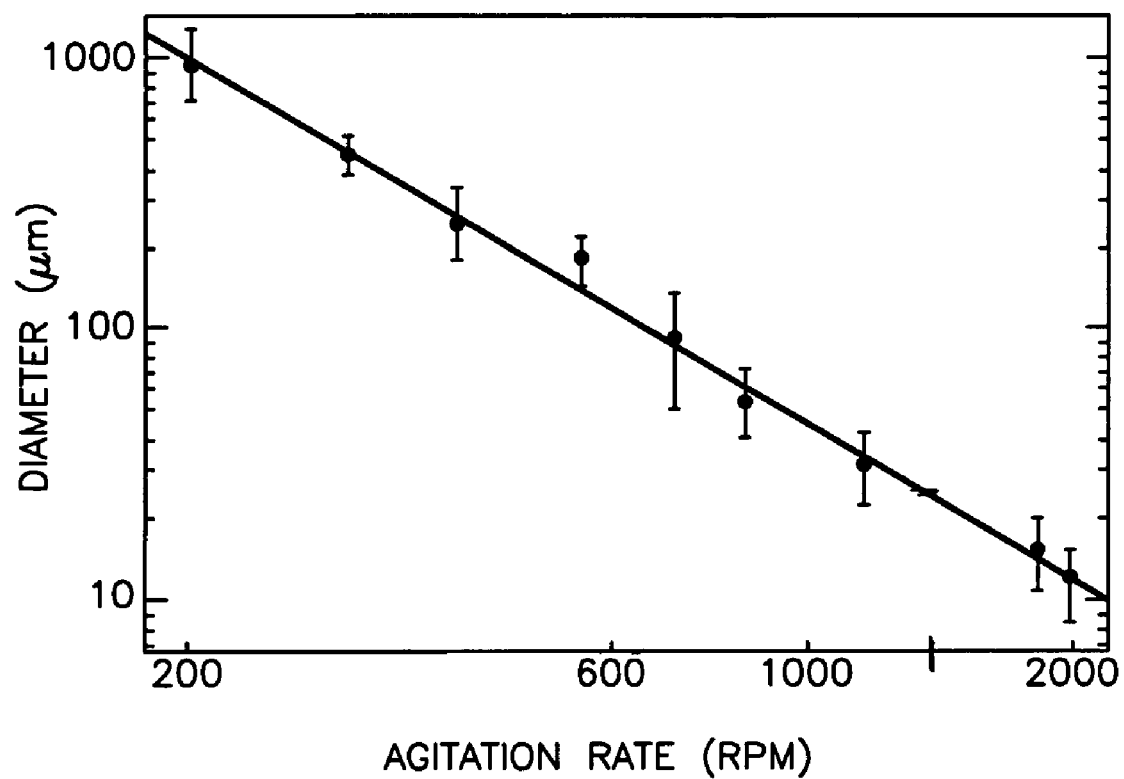
FIG. 4 is a graph that depicts the relationship of the agitation rate vs. the capsule size in the manufacture of the capsules.

It is preferred that the capsules 20 comprise from about 5% to about 20%, and more preferably about 10%, by weight of the material 18. It is also preferred that the catalyst 28 comprise an effective amount (to perform its catalyzing function) up to about 5%, preferably between about 2.5% and 5%, by weight of the material 18. A description of this process is detailed in "letters to nature" in *Nature* magazine, 15 Feb. 2001, entitled "Autonomic healing of polymer composites" by S. R. White, et al, the contents of which are incorporated herein by reference. This article does not describe how to make capsules less than about 25 microns in diameter. However, a technique to make capsules this small is described in an article by E. N. Brown et al entitled "In situ poly(urea-formaldehyde) microencapsulation of dicyclopentadiene" submitted for publication in the *Journal of Microencapsulation*, 2003, and which is available on the internet at web site http://www.tam.uiuc.edu/publications/tam reports/2003/1014.pdf, the contents of which are hereby incorporated by reference. Attention is directed specifically to pages 5 and 6 of the internet version of this article. FIG. 4 thereof is a graph contained on page 6 of this article. As stated on page 6 with respect to the graph, FIG. 4 depicts "Mean microcapsule diameter vs. agitation rate. Size analysis was performed by optical microscopy on data sets of at least 250 measurements at each agitation rate. Error bars correspond to one standard deviation of the data. The solid line corresponds to a linear fit of the entire data on log-log scale." As can be gleaned from FIG. 4, in order to obtain an average capsule size of 25 microns diameter or less the processing speed would have to be in excess of about 1400 RPM, and to obtain an average capsule size of 10 microns the processing speed would have to be about 2000 RPM. (It should be noted that when capsule size is referred to herein, the reference is to average capsule size unless otherwise stated.)

As can be seen in FIG. 4, capsules of less than about 25 microns are formed at speeds of less than about 1400 rpm, and capsules of 10 micron are formed at speeds of about 2000 rpm.

What is claimed is:

1. A composition for self healing of cracks generated in underfill material between an I/C chip and a circuitized substrate, comprising;
    said underfill material having a cured epoxy base,
    a plurality of capsules dispersed in said epoxy base,
    each of said capsules being a curable thermosetting adhesive encapsulated in a rupturable shell to disperse said thermosetting adhesive in a crack formed in said epoxy base when said shell ruptures,
    each capsule being 10 microns or less in diameter, and
    a curing agent that will react with or cause a reaction of said thermosetting adhesive on contact to form a cured adhesive dispersed in said crack in said epoxy base, wherein the curing agent is a ruthenium-based catalyst.

2. The invention as defined in claim 1 wherein said thermosetting adhesive is dicycyclopentadiene.

3. The invention as defined in claim 1 wherein said shell is urea-formaldehyde.

4. The invention as defined in claim 1 wherein there is between about 5% and about 20% by weight of said capsules with respect to said underfill material.

5. The invention as defined in claim 4 wherein there is about 10% by weight of said capsules.

6. The invention as defined in claim 1 wherein there is an effective amount up to about 5% by weight of said curing agent.

7. A method of self-healing cracks that form in underfill material between an I/C chip and a circuitized substrate, wherein said underfill material has a cured epoxy base, comprising the steps of:
    providing a plurality of capsules dispersed in said epoxy base,
    each of said capsules being a curable thermosetting adhesive encapsulated in a rupturable shell to disperse said thermosetting adhesive in a crack formed in said epoxy base when said shell ruptures,
    each capsule being less than about 25 microns in diameter,
    a curing agent that will react with or cause a reaction of said thermosetting adhesive on contact to form a cured adhesive dispersed in said crack in said epoxy base,
    said shell rupturing when encountering said crack being propagated in said underfill material, and at least partially filling said crack with said adhesive, and curing said adhesive with said curing agent to bond the edges of said crack together.

8. The invention as defined in claim 7 wherein said thermosetting adhesive is dicycyclopentadiene.

9. The invention as defined in claim 7 wherein said shell is urea-formaldehyde.

10. The invention as defined in claim 7 wherein said curing agent is a ruthenium base catalyst.

11. The invention as defined in claim 7 wherein there is between about 5% and about 20% by weight of said capsules with respect to said underfill material.

12. The invention as defined in claim 11 wherein there is about 10% by weight of said capsules.

13. The invention as defined in claim 7 wherein there is an effective amount, up to about 2.5% by weight of said curing agent, to cure said thermosetting adhesive.

14. The invention as defined in claim 7 wherein the diameter of said capsules is about 10 microns or less.

* * * * *